United States Patent [19]

Ingalsbe

[11] Patent Number: 5,393,235

[45] Date of Patent: Feb. 28, 1995

[54] TELECOMMUNICATIONS TEST ADAPTER

[75] Inventor: David L. Ingalsbe, Hastings, Minn.

[73] Assignee: Independent Technologies, Inc., Egan, Minn.

[21] Appl. No.: 114,460

[22] Filed: Aug. 31, 1993

[51] Int. Cl.⁶ .............................................. H05K 1/00
[52] U.S. Cl. ..................................... 439/76; 439/886; 439/70
[58] Field of Search ................. 439/76, 638, 639, 654, 439/651, 709, 886

[56] References Cited

U.S. PATENT DOCUMENTS

| | | | |
|---|---|---|---|
| 3,123,428 | 3/1964 | McKee | 439/651 X |
| 3,745,515 | 7/1973 | Michaels | 439/651 OR |
| 4,878,848 | 11/1989 | Ingalsbe . | |
| 4,919,624 | 4/1990 | Masuda | 439/76 OR |
| 4,925,393 | 5/1990 | Ingalsbe | 439/638 X |
| 4,968,260 | 11/1990 | Ingalsbe . | |
| 5,192,226 | 3/1993 | Wang | 439/639 X |

Primary Examiner—David L. Pirlot
Assistant Examiner—Daniel Wittels
Attorney, Agent, or Firm—Joel Skinner

[57] ABSTRACT

A telecommunications adapter for use with a 110-type patch cord, comprising: a printed circuit board; at least two contact blades for making electrical contact with the 110-type patch cord, the blades having a predetermined configuration and being mounted to the printed circuit board; an electrical connection cable connected to the printed circuit board; and a housing structure having an interior cavity enclosing a predetermined portion of the printed circuit board, the housing structure having a connection end for contact with the 110-type patch cord, the connection end having a stabilizing end for the contact blades and a pair of clamps to engage the 110-type patch cord.

13 Claims, 7 Drawing Sheets

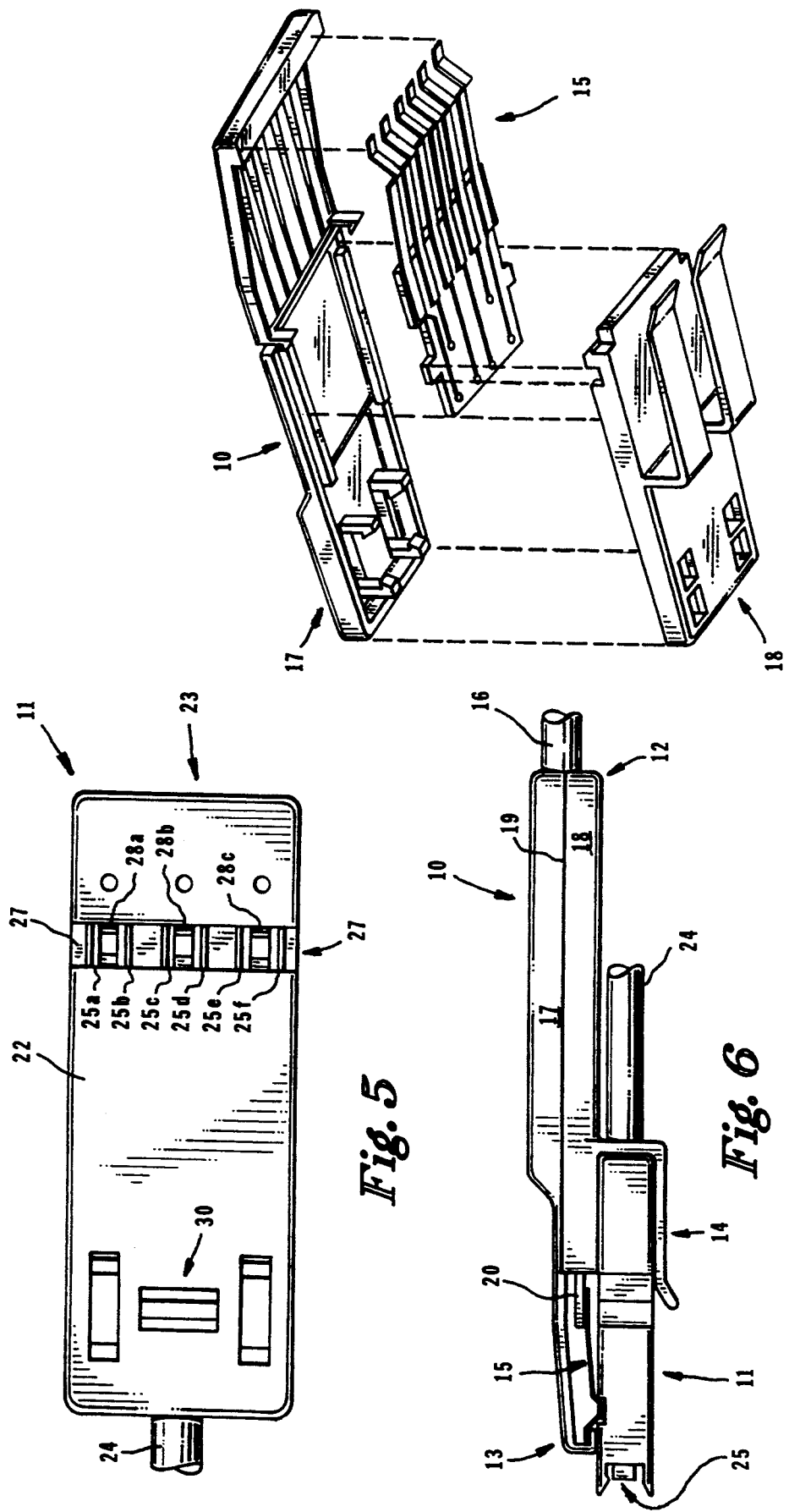

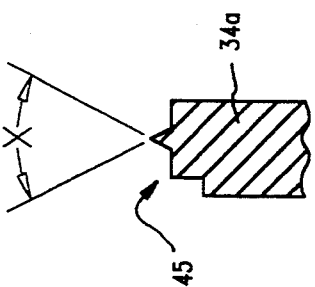
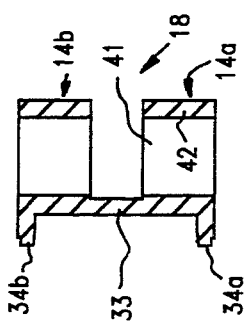
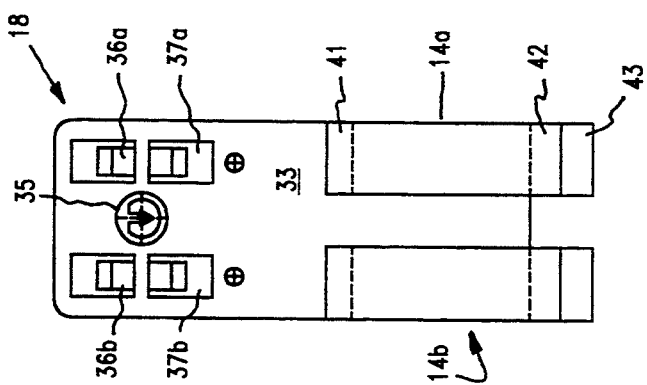
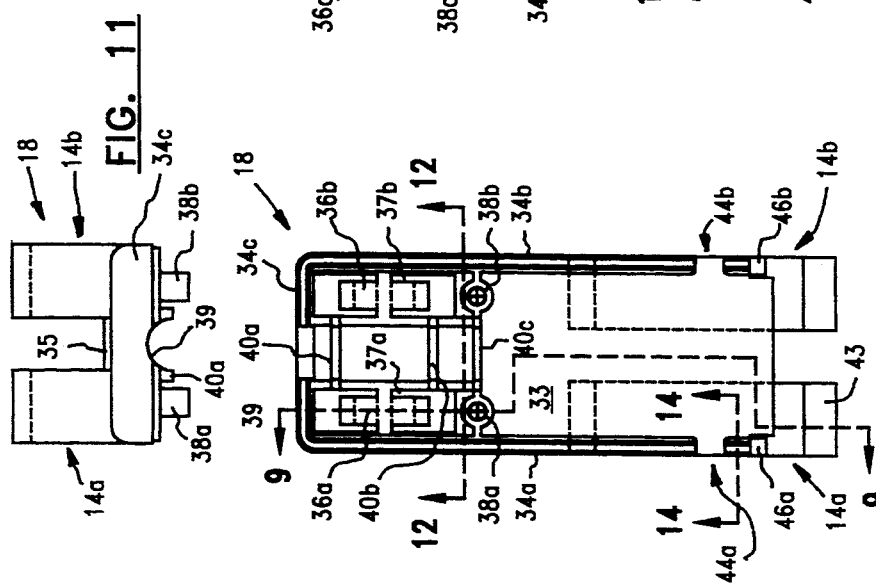
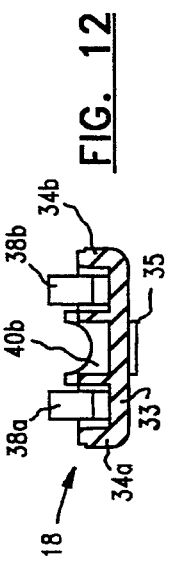
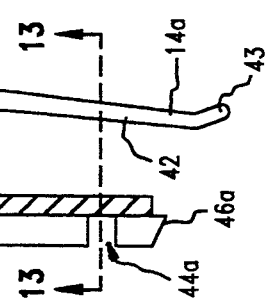

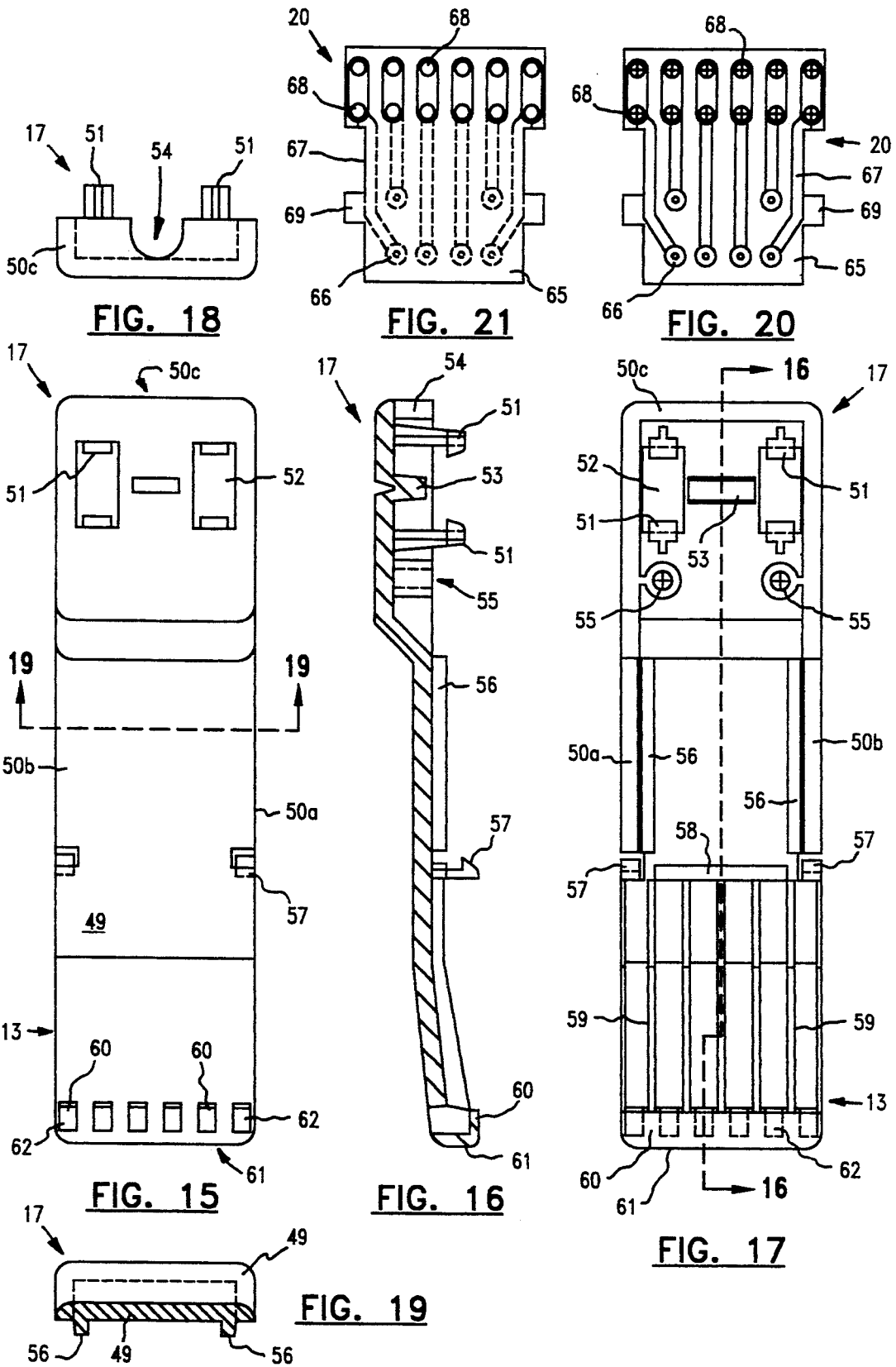

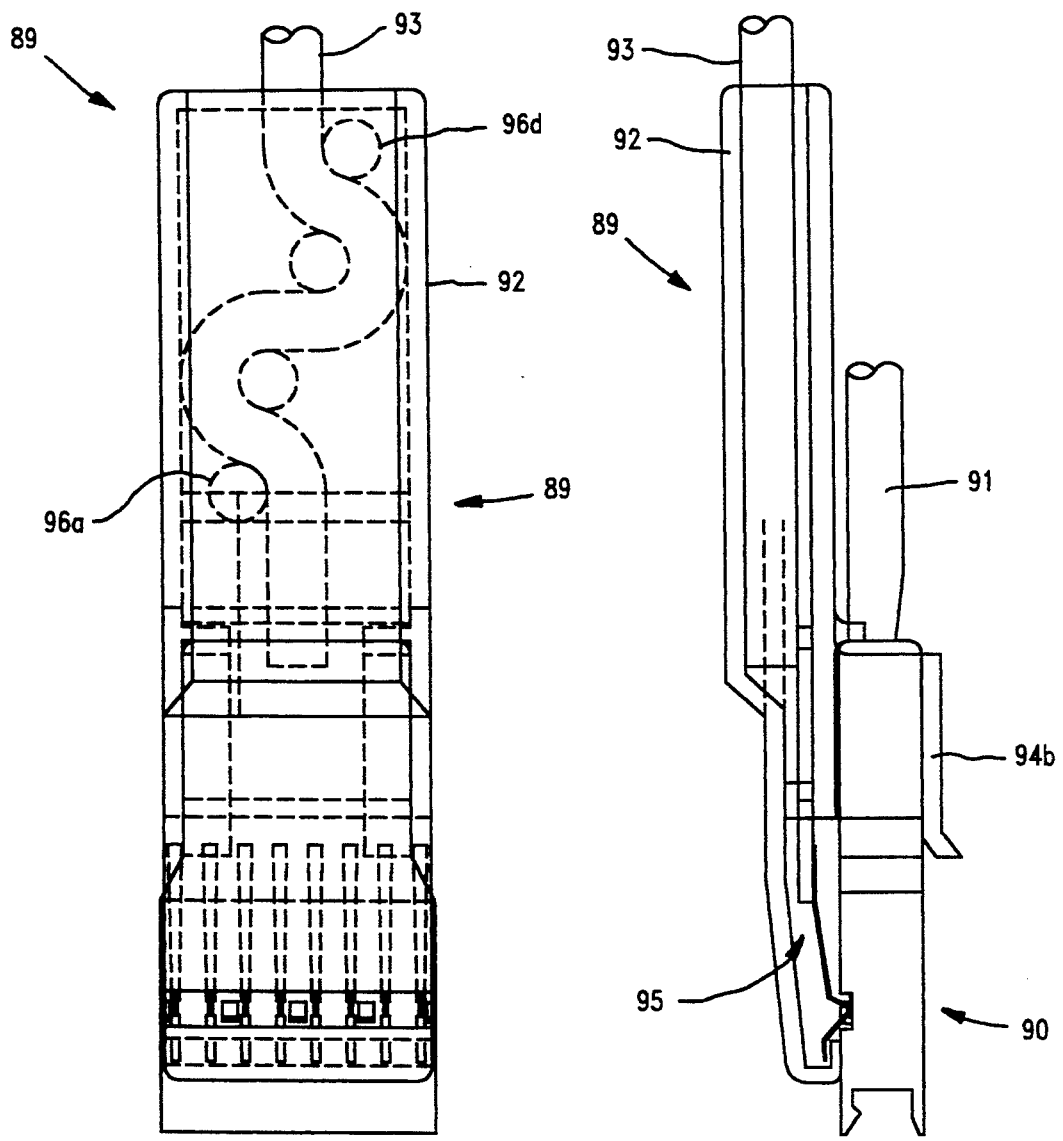
FIG. 27
FIG. 26
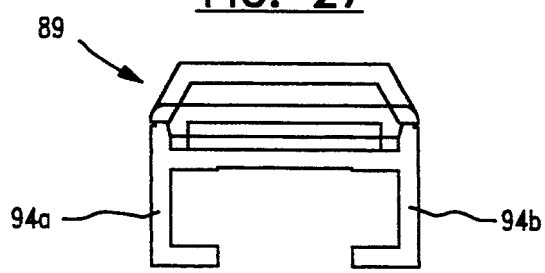
FIG. 28

TELECOMMUNICATIONS TEST ADAPTER

BACKGROUND OF THE INVENTION

1. Field of the Invention

This invention relates to telecommunications test equipment and more particularly to an adapter which couples to an ATT 110-type patch cord usable on a 110-type telecommunications block or interface. The adapter of this invention enables the user to monitor data and voice signals on a patch cord while the cord is still attached to the telecommunications block so that the user can monitor and test circuits thereon without disturbing such circuits.

2. Background Art

In the past, various devices and/or methods have been used and proposed to make connections to telecommunications blocks and specifically to patch into a particular circuit on the block. However, these devices and methods have significant limitations and shortcomings. Specifically, known adapters are incapable of monitoring and testing circuits and patch panels without disturbing the existing connections.

Despite the need in the art for an adapter which overcomes the shortcomings and limitations of the prior art, none insofar as is known has been developed or proposed. Accordingly, it is an object of the present invention to provide a telecommunications adapter which is connectable to an ATT 110-type patch cord. Another object of this invention is to provide an adapter which is connectable to such a patch cord and which does not disturb the existing connections or the circuits on the block so as to enable the user to monitor data and voice communications without disturbing such connections and circuits. It is a further object of this invention to provide an adapter which is durable, simple and economical to construct and which overcomes the limitations and shortcomings of the prior art.

SUMMARY OF THE INVENTION

A telecommunications adapter for use with a 110-type patch cord, comprising: a) a printed circuit board; b) at least two contact blades for making electrical contact with the 110-type patch cord, the blades having a predetermined configuration and being mounted to the printed circuit board; c) electrical connection means connected to the printed circuit board; and d) a housing structure having an interior cavity enclosing a predetermined portion of the printed circuit board, the housing structure having a connection end for contact with the 110-type patch cord, the connection end having means to stabilize the contact blades and means to engage the 110-type patch cord.

An important aspect of the invention is that the contact blades preferably have a flat dimension with a thin crossectional dimension. The contact blades are attached to the printed circuit board along a flat dimension via contact posts along and adjacent an edge of the printed circuit board, the contact blades further extending outwardly from the printed circuit board a predetermined distance and engaging the housing structure connection end stabilization means. Preferably each blade further comprises a flat planar first portion having the contact posts, a second portion extending from the first portion at an angle "A", a third portion extending from the second portion, the third portion having proximal and distal bent members wherein the proximal bent member forms an angle "B" with respect to the plane of the first portion and wherein the proximal and distal members are bent with respect to each other at and angle "C", the blade further having a fourth portion which extends from the distal member of the third portion. Preferably, angle "A" is approximately eleven degrees, angle "B" is approximately seventy-five degrees, and angle "C" is approximately one hundred and fifteen degrees.

Another important aspect of the invention is that housing structure has a generally flat, rectilinear configuration with a proximal portion containing the interior cavity and having an aperture at the connection end through which the printed circuit board extends outwardly. The stabilization means comprises a flat member extending from the connection end of the proximal portion and having longitudinally oriented rails, and terminating in a lateral rail having at least one stabilization aperture therein for receiving the outwardly extended end of the contact blade. Preferably, the housing structure means to engage comprises a pair of spatially parallel clamp members extending from a bottom surface of the housing structure and towards the connective end thereof. The clamp members further comprise a back portion which extends from the bottom surface of the housing structure, an elongated arm portion which extends towards the connection end from the back portion extended end, and a beveled end portion, the arm portion being slightly angled towards the housing structure.

The benefits of this invention will become clear from the following description by reference to the drawings.

BRIEF DESCRIPTION OF THE DRAWINGS

FIG. 5 is a bottom view of the patch cord connector shown in FIGS. 3 and 4.

FIG. 6 is a side view of the adapter operatively connected to the patch cord connector.

FIG. 7 is an exploded view of the adapter.

FIG. 8 is a top view of the interior side of the bottom case of the adapter.

FIG. 9 is a crossectional view of the bottom case taken along line 9—9 of FIG. 8.

FIG. 10 is a top view of the exterior side of the bottom case.

FIG. 11 is an end view of the bottom case.

FIG. 12 is a crossectional view of the bottom case taken along line 12—12 of FIG. 8.

FIG. 13 is a crossectional view of the bottom case taken along line 13—13 of FIG. 9.

FIG. 14 is a crossectional view of a portion of the bottom case taken along line 14—14 of FIG. 8.

FIG. 15 is a top view of the exterior side of the top case of the adapter.

FIG. 16 is a crossectional view of the top case taken along line 16—16 of FIG. 17.

FIG. 17 is a top view of the interior side of the top case.

FIG. 18 is an end view of the top case.

FIG. 19 is an opposite end view of the top case.

FIG. 20 is a top view of the top side of the printed circuit board (PCB) of the adapter.

FIG. 21 is a top view of the bottom side of the PCB.

FIG. 26 is a side view of another alternative embodiment of the adapter of this invention, shown operatively connected to a patch cord connector.

FIG. 27 is a top view of the adapter of FIG. 26.

FIG. 28 is an end view of the adapter shown in FIGS. 26 and 27.

DESCRIPTION OF THE PREFERRED EMBODIMENT

The apparatus of the present invention is usable to monitor or test a communications or data circuit from an ATT 1,2,3 or 4 conductor 110 patch cord. The patch cord, as is known in the art, is plugged into the mating surface of a 110 telecommunications interface or block which is commonly used as a demarcation point in telecommunications systems. The adapter apparatus is mated with the patch cord while it is connected to the block by, generally, connecting it to the back or top surface of the patch cord end connector. From this point various equipment such as multimeters and the like may be connected to a modular connector at the end of an adapter cable and monitoring or testing may be made on the telecommunications circuits without interrupting or disconnecting them.

Figure 1:
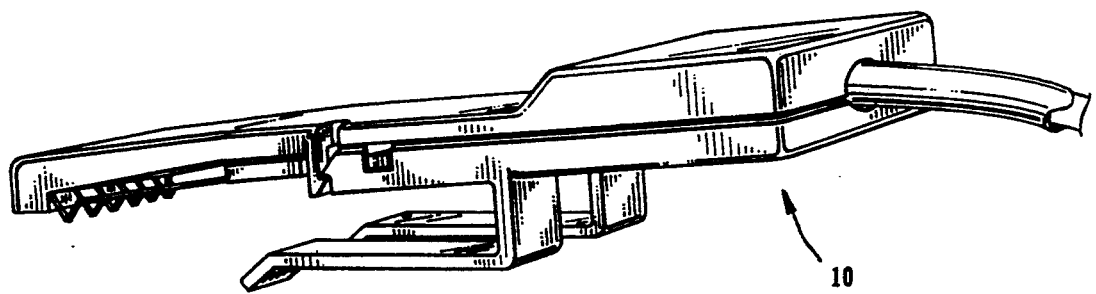
FIG. 1 is a perspective view of the telecommunications adapter of the present invention.
Figure 2:
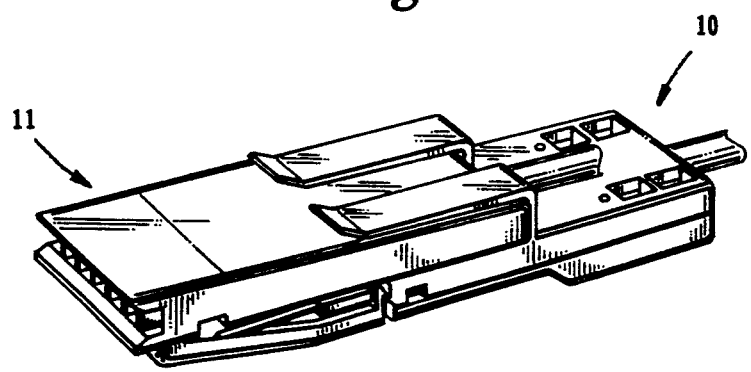
FIG. 2 is a perspective view of the telecommunications adapter operatively connected to an ATT 110-type patch cord connector.

Referring to FIGS. 1 and 2, the adapter 10 has a compact, hand holdable configuration with a rectilinear, thin, relatively flat body or case 12, and a cable 16 which extends from one of its ends (proximal). The body is preferably constructed of a rigid plastic material. A modular connector (not shown) is preferably connected to the extended end of the cable 16. The opposite (distal) end 13 of the adapter body 12 is configured for electrical connection to the 110 block patch cord 11. A pair of clamps 14 extend from the bottom surface of the adapter body 12 for attachment to the patch cord 11. A plurality of electrical contacts 15 are shown disposed generally at the connective end 13 of the adapter 10. The contacts 15 extend from a printed circuit board (PCB) 20. Preferably, the adapter case 12 has a bifurcated structure with top and bottom portions 17 and 18 which are shown joined together along seam or joint 19. The cord 16 is electrically connected to the PCB 20 and extends through an interior, central cavity in the body 12 and out the proximal end. The PCB 20 is partly housed in the body 20 cavity and extends outwardly a predetermined distance at the connection end 13.

Figure 3:
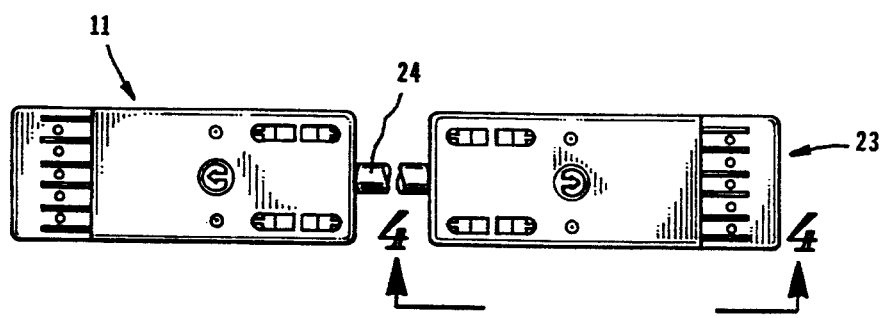
FIG. 3 is a top view of an ATT 110-type patch cord connector.
Figure 4:
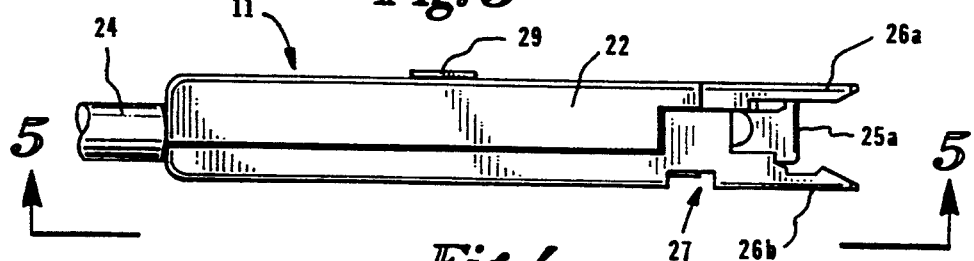
FIG. 4 is a side view of one end of the patch cord connector shown in FIG. 3.

Referring also to FIGS. 3–4, the 110 patch cord 11 has a rectangular, thin and flat configuration and generally comprises a body 22 with a connection end 23, and a cable 24 extending from an opposite end. A plurality of blade-like contacts 25 extend from the body 22 at the connection end 23 and are bordered on top and bottom sides by clamp members 26. This structure permits the patch cord 11 to be firmly attached to the mating surface of a 110 style block and to make electrical connections therewith. A connection groove 27 is located on the top surface of the of the body 22 and exposes a predetermined portion of each contact 25. Alignment bodies 28 are disposed between pairs of contacts 25. A universal alignment symbol 29 is disposed on the bottom surface of the body 22. The patch cord body 22 includes a connection assembly 30.

Referring to FIGS. 2 and 6, in use, the adapter 10 is oriented by the user with the clamps 14 extending downwardly and aligned over the top of the patch cord 11. The adapter 10 is brought in from behind the patch cord 11 and urged longitudinally thereover until a tight connection is made. The patch cord cable 24 extends rearwardly between the clamps 14 of the adapter 10. When operatively connected, the connection end 13 of the adapter 10 is disposed short of or behind the connection end 23 of the patch cord 11 so as not to interfere with the connection between the patch cord 11 and the block. The adapter contact 15 ends contact the patch cord blades 25 along the connection groove 27. In this configuration, the circuit formed by the patch cord blades 25 with the block (not shown) is not broken by contact with the adapter contacts 15.

Referring to FIGS. 8–14, the bottom portion 18 of the adapter body 12 has a generally rectangular configuration with a major face 33 and three minor or side faces 34a,b,c. An alignment symbol 35 is disposed on the exterior side of the major face 33 to aid the operator in connecting the adapter 10 to the patch cord 11. A pair of connection clamps 36a,b and clamp apertures 37a,b are disposed on the interior side of the major face 33 for releasable connection with complementary structures on the top part 17 of the body 12. Also, connection posts 38a,b are disposed on the sides 34. A cable aperture 39 is disposed at one end of the bottom portion 18. Cable supports 40a,b,c are shown to be located between the clamp apertures 37. A pair of PCB alignment notches 44a,b are disposed on the sides 34 for proper alignment and stabilization of the inserted PCB 20. Connection notches 46a,b are further disposed at the far ends of the sides 34 for mating connection with complementary structures on the body top 17 to form the unitary body 12. A sonic weld joint 45 forming an angle "X" of approximately sixty degrees is preferably disposed along the sides 34.

Each of the clamps 14 of the body bottom 18 are shown to comprise a back portion 41 which extends at approximately a 90 degree angle from the outside surface of the body 18, an elongated arm portion 42 which extends towards the connection end 13 of the adapter 10 from the outward end of the back 41, and a beveled end portion 43. The arm portion 42 is shown to angle slightly towards the body 18.

Referring to FIGS. 15–21, the top portion 17 of the body 12 has a generally rectangular and flat configuration with a major face 49 and three peripheral minor or side faces 50a,b,c. Four connection clamp holders 51 are disposed proximate a pair of clamp apertures 52. These structures 51 and 52 mate with the connection clamps 36, and clamp apertures 37 on the bottom portion 18 to releasibly clamp the top and bottom 17 and 18 together. A cord clamp 53 is disposed between the clamp apertures 52 and cooperates with the supports 40 on the bottom 18 to provide a strain relief clamping assembly for the adapter cable or cord 16. Similarly, a cable aperture 54 aligns with a complementary structure on the bottom 18 to form a generally circular cable aperture through which the cable 16 extends. A pair of connection apertures 55 are located near the clamp holders 51. The connection apertures 55 mate with connection posts 38 on the body bottom 18. Side rails 56 are disposed along a predetermined portion of the periphery of the top 17. Connection clamps 57 mate with notches 46 on the bottom 18. A front rail 58 is disposed between the connection clamps 57 and forms an aperture through which the printed circuit board 20 extends from the interior cavity.

The connection end 13 of the body top 17 basically comprises a thin flat structural member with a flat top surface and several spatially parallel longitudinal rails 59 on a bottom surface, a lateral rail 60, a forward rail 61 and several apertures 62. These structures cooperate with elements of the electrical assembly to provide reliable electrical connections as is discussed further below.

Referring to FIGS. 20–21, the electrical assembly of the adapter 10 basically comprises the contact blades 15, the PCB 20, and the cable 16. The blades 15 are attached to the PCB 20 via blade connection apertures 68. The conductors in the cable 16 are connected to the PCB 20 via wire connection apertures 66. Conductive traces 67 in the PCB 20 connect each cable 16 conductor to a blade 15. The PCB 20 also preferably has a pair of alignment bodies 69 which mate with alignment notches 44 on the body bottom 18 to ensure proper orientation of the electrical assembly with the body 12, particularly its connection end 13.

Figure 23:
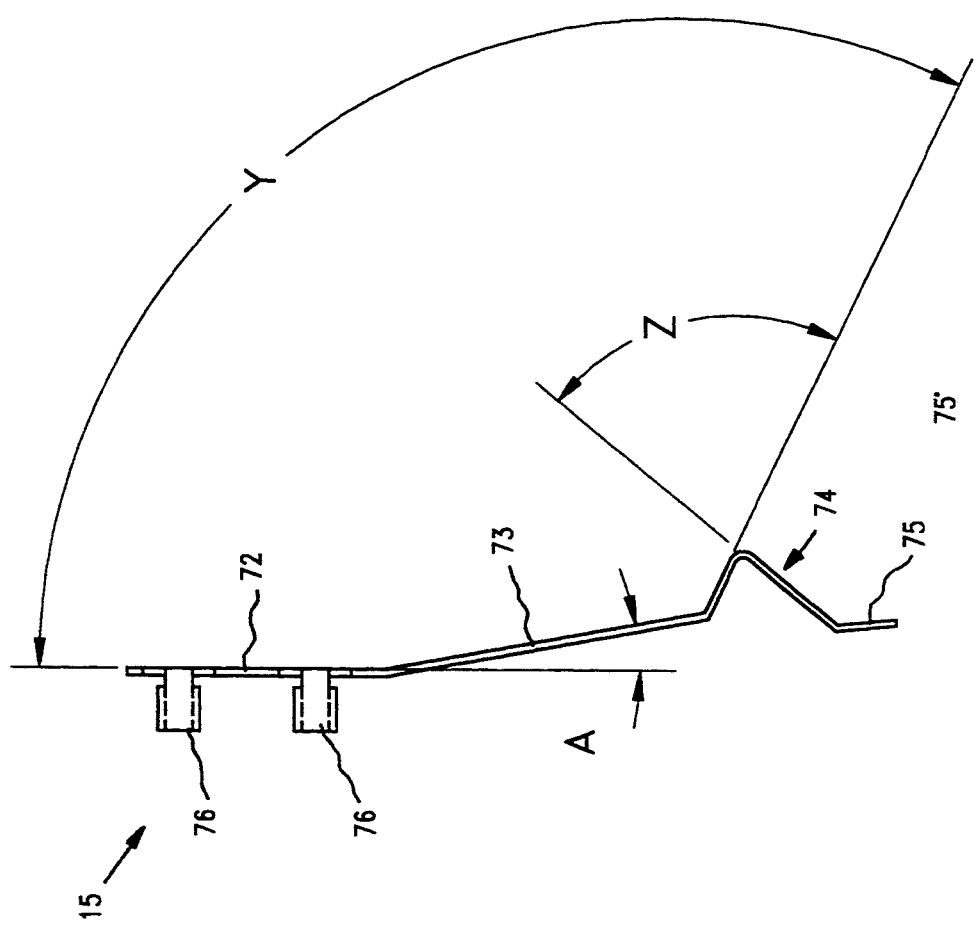
FIG. 23 is a side view of the connection blade.
Figure 22:
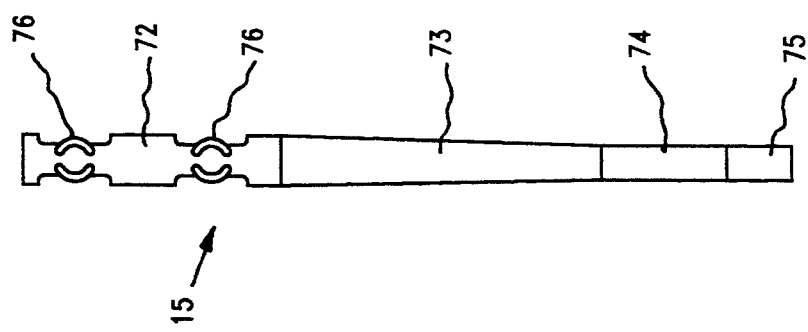
FIG. 22 is a top view of the connection blade of the adapter.

As is best shown in FIGS. 1, 6 and 7, the blades 15 extend outwardly from the PCB 20 and are stabilized at their extended end by the lateral rail 60, forward wall 61 and apertures 62. Referring also to FIGS. 22 AND 23, each blade 15 comprises a first or proximal portion 72, a second portion 73, a third angled portion 74 and a fourth or distal portion 75. Connection posts 76 are connected to the first portion 72 for mating with the blade connection apertures 68 of the PCB 20. Importantly, the second portion 73 is angled with respect to the first portion 72 approximately eleven degrees ("A"). The third portion is further bent at an angle of approximately seventy-five degrees ("Z"). And, the angle "Y" formed between the plane of the first portion 72 and the proximal bent member of the third portion 74 is approximately one hundred and eleven degrees. This structure provides optimal, electrical connections between the adapter 10 and the patch cord 11 which are reliable and which can be re-established through a plurality of use cycles. The blades 15 are preferably constructed of an approximately 0.020 inch thick Beryllium Copper alloy which is half hardened during formation and heat treated to full hardness after forming. The third and fourth portions 74 and 75 are finished in 100 micro-inch Nickel underlayment with selective plate 50 micro-inch Gold for contact with the patch cord 11 electrodes.

Figure 25:
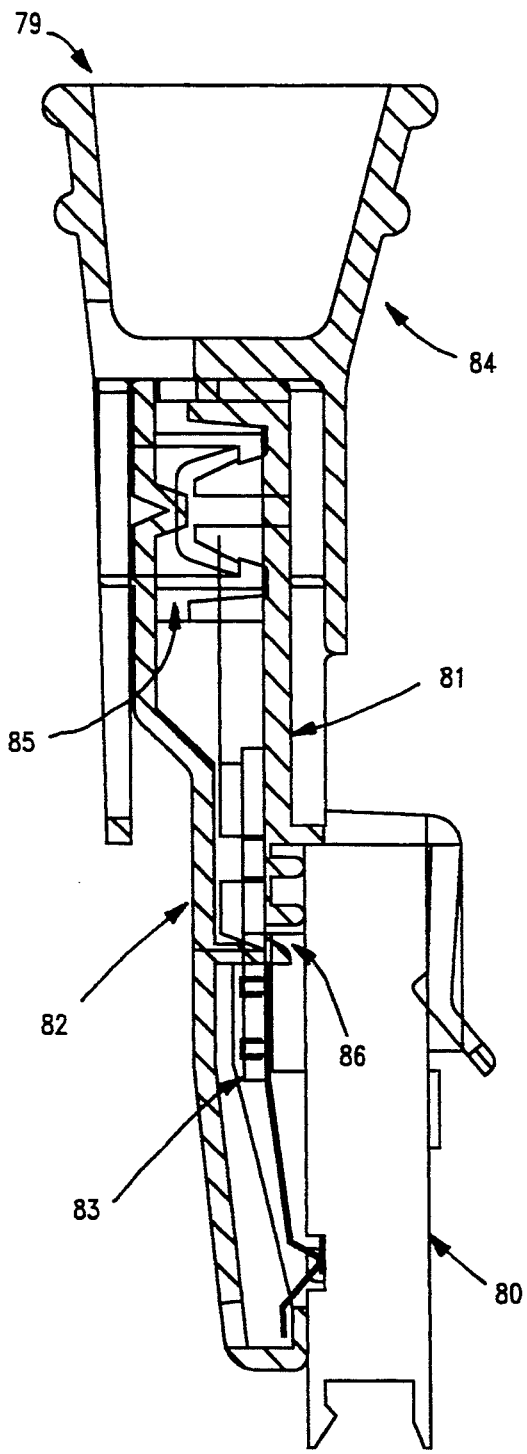
FIG. 25 is a crossectional view of the adapter of FIG. 24, shown operatively connected to a patch cord connector.
Figure 24:
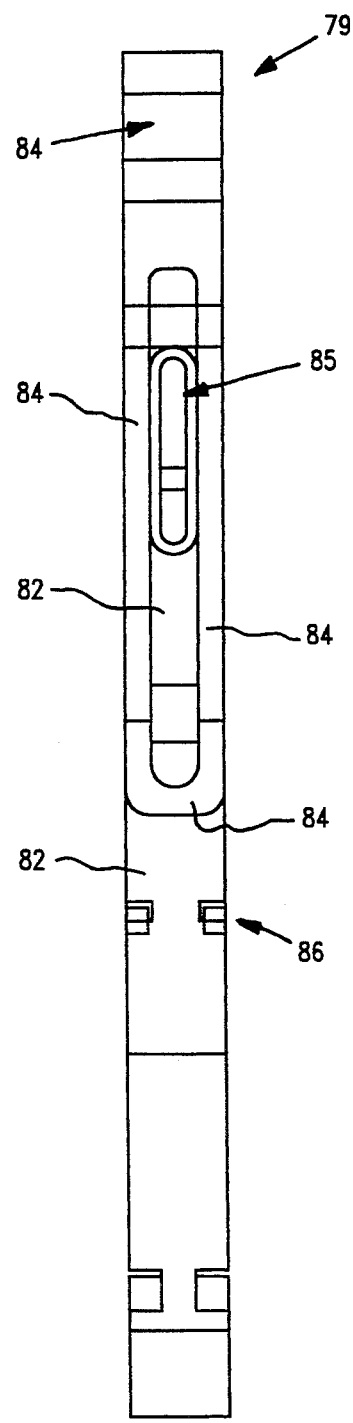
FIG. 24 is a top view of an alternative embodiment of the adapter of this invention.

Although the adapter 10 embodiment shown and described heretofore is constructed and arranged for use with a telephone industry standard three-pair (six conductor) circuit arrangement, adapters may also be constructed for single-pair, two-pair and four-pair systems utilizing the teachings of this invention. Referring to FIGS. 24 and 25, a single-pair adapter 79 is shown attached to a single-pair patch cord connection end 80. The adapter 79 basically comprises a case bottom 81, a case top 82, a PCB assembly 83, and a clip 84. The bottom and top cases 81 and 82 are connected via a proximal clamp assembly 85 and a distal clamp assembly 86. Referring to FIGS. 26–28, a four-pair adapter 89 is shown attached to a four-pair patch cord connection end 90 and cable 91. The adapter 89 basically comprises a case or body 92, a cable 93, a clamp 94, a PCB assembly 95 and strain relief posts 96a,b,c and d.

As many changes are possible to the embodiments of this invention utilizing the teaching thereof, the descriptions above, and the accompanying drawings should be interpreted in the illustrative and not the limited sense.

That which is claimed is:

1. A telecommunications adapter for use with a 110-type patch cord, comprising:
   (a) a printed circuit board;
   (b) at least two contact blades for making electrical contact with the 110-type patch cord, said blades having a predetermined configuration and being mounted to said printed circuit board;
   (c) electrical connection means connected to said printed circuit board; and
   (d) a housing structure having a generally flat, rectilinear configuration with a proximal portion including an interior cavity enclosing a predetermined portion of said printed circuit board, said housing structure further having a connection end for contact with the 110-type patch cord, said connection end having an aperture through which said printed circuit board extends outwardly, means to stabilize said contact blades and means to engage the 110-type patch cord, said means to stabilize comprising a flat member extending from said connection end, having longitudinally oriented rails, and terminating in a lateral rail having at least one stabilization aperture therein for receiving the outwardly extended end of said contact blades.

2. The adapter of claim 1, wherein said printed circuit board has a flat, planar, rectilinear configuration with at least one solder connection aperture disposed along one edge thereof for each contact blade be mounted therein, each solder connection aperture further having a conductive trace extending therefrom to a wire to solder connection disposed along another edge of said printed circuit board.

3. The adapter of claim 1, wherein said contact blades have a flat dimension with a thin crossectional dimension, said contact blades being attached to said printed circuit board along a flat dimension via contact posts along and adjacent an edge of said printed circuit board, said contact blades further extending outwardly from said printed circuit board a predetermined distance and engaging said housing structure connection end stabilization means.

4. The adapter of claim 3, wherein each said blade further comprises a flat planar first portion having said contact posts, a second portion extending from said first portion at a first angle, a third portion extending from said second portion, said third portion having proximal and distal bent members wherein said proximal bent member forms a second angle with respect to the plane of said first portion and wherein said proximal and distal members are bent with respect to each other at a third angle, said blade further having a fourth portion which extends from said distal member of said third portion.

5. The adapter of claim 4, wherein said first angle is eleven degrees, said second angle is seventy-five degrees, and said third angle is one hundred and fifteen degrees.

6. The adapter of claim 1, wherein there are a number of blades, said number being selected from the group of numerals consisting of 2, 4, 6 and 8.

7. The adapter of claim 1, wherein said blades are constructed of 0.020 inch thick Beryllium Copper alloy which is half hardened during formation and heat treated to full hardness after forming, said blades being coated at predetermined portions with 100 micro-inch Nickel underlayment with selective plate 50 micro-inch Gold.

8. The adapter of claim 1, wherein said electrical connection means is a cable having at least two discreet conductors which are connected to said printed circuit board, said cable extending through said housing structure interior cavity and out of said cavity via an exit aperture.

9. The adapter of claim 8, wherein said cable further has a modular connector connected at an extended end thereof.

10. The adapter of claim 1, wherein said housing structure is bifurcated and has top and bottom portions and wherein said housing structure is constructed of a rigid plastic material.

11. The adapter of claim 1, wherein said housing structure means to engage comprises a pair of spatially parallel clamp members extending from a bottom surface of said housing structure and towards said connective end thereof.

12. The adapter of claim 11, wherein said clamp members further comprise a back portion which extends from the bottom surface of said housing structure, an elongated arm portion which extends towards said connection end from said back portion extended end, and a beveled end portion, said arm portion being slightly angled towards said housing structure.

13. A telecommunications adapter for use with a 110-type patch cord, comprising:
 (a) a printed circuit board;
 (b) at least two contact blades for making electrical contact with the 110-type patch cord, said blades having a predetermined configuration and being mounted to said printed circuit board, said blades being constructed of approximately 0.020 inch thick Beryllium Copper alloy which is half hardened during formation and heat treated to full hardness after forming, said blades being coated at predetermined portions with 100 micro-inch Nickel underlayment with selective plate 50 micro-inch Gold;
 (c) electrical connection means connected to said printed circuit board; and
 (d) a housing structure having an interior cavity enclosing a predetermined portion of said printed circuit board, said housing structure having a connection end for contact with the 110-type patch cord, said connection end having means to stabilize said contact blades and means to engage the 110-type patch cord.

* * * * *